(12) United States Patent
Kihara

(10) Patent No.: US 7,265,412 B2
(45) Date of Patent: Sep. 4, 2007

(54) SEMICONDUCTOR MEMORY DEVICE HAVING MEMORY CELLS REQUIRING NO REFRESH OPERATION

(75) Inventor: Yuji Kihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/594,800

(22) Filed: Nov. 9, 2006

(65) Prior Publication Data

US 2007/0058418 A1    Mar. 15, 2007

Related U.S. Application Data

(62) Division of application No. 10/867,787, filed on Jun. 16, 2004, now Pat. No. 7,141,835.

(30) Foreign Application Priority Data

Jun. 20, 2003    (JP) .............................. 2003-176906

(51) Int. Cl.
*H01L 29/788*    (2006.01)
*H01L 29/792*    (2006.01)
*H01L 27/10*    (2006.01)
*H01L 29/73*    (2006.01)

(52) U.S. Cl. ...................... 257/320; 257/207; 257/208; 257/317; 257/321; 257/322; 257/326

(58) Field of Classification Search ........ 257/207–208, 257/317, 320–322, 326
See application file for complete search history.

(56) References Cited

U.S. PATENT DOCUMENTS

| 3,876,993 | A |   | 4/1975  | Cavanaugh |
|-----------|---|---|---------|-----------|
| 5,311,470 | A |   | 5/1994  | Atsumi et al. |
| 5,443,999 | A | * | 8/1995  | Uenishi et al. ............. 438/138 |
| 5,541,870 | A | * | 7/1996  | Mihara et al. ............. 365/145 |
| 5,671,174 | A |   | 9/1997  | Koike et al. |
| 5,943,256 | A |   | 8/1999  | Shimizu et al. |
| 6,104,639 | A | * | 8/2000  | Hayashi et al. ............. 365/187 |
| 6,144,583 | A | * | 11/2000 | Shiba ..................... 365/185.13 |
| 6,204,106 | B1 | * | 3/2001  | Gonzalez .................... 438/238 |
| 6,313,501 | B1 | * | 11/2001 | Kwon ........................ 257/317 |

(Continued)

FOREIGN PATENT DOCUMENTS

JP    7-307445    11/1995

(Continued)

*Primary Examiner*—Ida M. Soward
(74) *Attorney, Agent, or Firm*—McDermott Will & Emery LLP

(57) ABSTRACT

A memory cell includes first and second data holding portions for holding stored data and its inverted data. First and second p channel TFT compensate for charges leaked from first and second capacitors, respectively. A first (second) access transistor has first and second gate electrodes connected to a first (second) word line and to a second (first) node, respectively. The first (second) access transistor discharges the charges leaked from a power supply node via the first (second) p channel TFT in the OFF state in the leakage mode where the first (second) word line is inactivated and the second (first) node is at an H level.

7 Claims, 14 Drawing Sheets

U.S. PATENT DOCUMENTS

| | | |
|---|---|---|
| 6,625,056 B1 | 9/2003 | Kihara |
| 6,775,176 B2 | 8/2004 | Kihara |
| 7,190,023 B2 * | 3/2007 | Kamigaki et al. .......... 257/316 |
| 2002/0054523 A1 | 5/2002 | Mizugaki et al. |
| 2003/0058701 A1 | 3/2003 | Takashima |
| 2003/0202413 A1 | 10/2003 | Komura et al. |
| 2003/0219944 A1 * | 11/2003 | Kato et al. ................. 438/257 |
| 2004/0027876 A1 | 2/2004 | Takahashi et al. |

FOREIGN PATENT DOCUMENTS

| | | |
|---|---|---|
| JP | 11-111929 A | 4/1999 |
| KR | 1999-0036748 | 5/1999 |

* cited by examiner

SEMICONDUCTOR MEMORY DEVICE HAVING MEMORY CELLS REQUIRING NO REFRESH OPERATION

RELATED APPLICATIONS

This application is a divisional of Application Ser. No. 10/867,787, filed Jun. 16, 2004 now U.S. Pat No. 7,141,835, which claims priority of Japanese Patent application No. 2003-176906(P), filed Jun. 20, 2003, the contents of which are herewith incorporated by reference.

BACKGROUND OF THE INVENTION

1. Field of the Invention

The present invention relates to semiconductor memory devices, and more particularly to a semiconductor memory device which stores stored information according to whether a charge holding circuit is holding charges or not and for which a refresh operation is unnecessary.

2. Description of the Background Art

A dynamic random access memory (DRAM), one of typical semiconductor memory devices, has a memory cell formed of a transistor and a capacitor and the structure of the memory cell in itself is simple. Such a DRAM is most suitable for realizing higher integration and larger capacity of a semiconductor device, and thus has currently been used for various electronic apparatuses.

In a memory cell of the DRAM, charges of the capacitor, corresponding to stored data, would leak due to various factors and are lost gradually. It means that the stored data is lost over time. Thus, in the DRAM, a "refresh operation" is performed with which data is once read and rewritten before it becomes impossible to detect a voltage change appearing on the bit lines corresponding to the stored data at the time of data reading.

As such, the DRAM, for which the refresh operation should be performed constantly and periodically for every memory cell, is inferior in terms of a high-speed operation and low power consumption to a static random access memory (SRAM) that does not require the refresh operation. The DRAM, however, has a simple memory cell structure and enables higher integration as described above. It has a cost per bit considerably lower than those of the other memory devices, and thus is now dominant in the RAMs.

On the other hand, the SRAM, also one of the typical semiconductor memory devices, does not require the refresh operation indispensable for the DRAM, as described above.

A memory cell of the SRAM has a configuration where a flip flop having two inverters cross-coupled to each other is connected to a bit line pair via transistors. The data stored in the flip flop is in a bistable state, and maintains the state as long as a prescribed power supply voltage is supplied. In this point, the SRAM is completely different from the DRAM in which charges accumulated in the capacitor are lost over time.

The SRAM requiring no refresh operation consumes less power, with which an operation of higher speed than that of the DRAM is expected.

A memory cell of the SRAM, however, generally includes six bulk transistors. It has four bulk transistors even in the case where the load element is formed of a thin film transistor (TFT) (hereinafter, the thin film transistor is also referred to as "TFT"). Herein, the term "bulk" is used to express a transistor that is formed within a silicon substrate, in contrast to the TFT formed on a substrate. Hereinafter, a transistor that is formed within the silicon substrate is referred to as the "bulk-transistor", in contrast with a thin film element formed on a substrate, as is the TFT.

As such, a memory cell of the SRAM including six or four bulk transistors is large in size compared to a memory cell of the DRAM having one bulk transistor, with their difference in area being as large as about tenfold.

As a semiconductor memory device that can realize lower power consumption and higher integration than a DRAM, Japanese Patent Laying-Open No. 7-307445 discloses a technique concerning a semiconductor memory device having a memory cell requiring no refresh operation and operating at a low voltage, where a conductive sidewall is configured for use as a gate electrode, and Coulomb barrier is utilized.

As described above, although the currently dominant DRAM is suitable for higher integration and larger capacity because of its simple memory cell structure, it requires the refresh operation, hindering a high-speed operation and low power consumption.

On the other hand, although the SRAM does not require the refresh operation, it requires six or four bulk transistors. Further, for stabilization of an operation of the SRAM, the current driving capability ratio (also referred to as "cell ratio" or "β ratio") between the driver and access transistors should be maintained at 2 to 3 or more, and the driver transistor should be designed to have a large gate width, which also causes an increase in size of the memory cell of the SRAM. As such, higher integration and larger capacity cannot be expected with a conventional SRAM.

As such, the conventional DRAM and SRAM both have advantages and disadvantages in terms of properties and structures. With further advance of the IT technologies expected in the future, there is a great expectation for a semiconductor memory device that can satisfy higher performance (higher-speed operation and lower power consumption) as well as higher integration and larger capacity.

Moreover, although the semiconductor memory device disclosed in Japanese Patent Laying-Open No. 7-307445 may allow lower power consumption and higher integration than a DRAM, it would be much more beneficial from the standpoints of development cost, manufacturing cost, compatibility and many other aspects if a semiconductor memory device that can solve the above-described problems can be developed based on the currently dominant DRAM and SRAM and by applying the techniques cultivated in the relevant field.

SUMMARY OF THE INVENTION

The present invention has been made to solve the above-described problems, and an object of the present invention is to provide a semiconductor memory device provided with memory cells that requires no refresh operation and realizes higher integration and larger capacity.

According to the present invention, a semiconductor memory device includes a memory cell storing data, and a bit line pair and at least one word line connected to the memory cell. The memory cell includes first and second charge holding circuits holding charges corresponding to the data and charges corresponding to inverted data of the data, respectively, first and second access transistors provided between one bit line of the bit line pair and the first charge holding circuit and between the other bit line of the bit line pair and the second charge holding circuit, respectively, and each having first and second gate electrodes, and first and second charge compensating circuits compensating for charges leaked from the first and second charge holding circuits, respectively. Each of the first gate electrodes of the first and second access transistors is connected to a corresponding word line. The second gate electrode of the first access transistor is connected to a first node that interconnects the second charge compensating circuit, the second charge holding circuit and the second access transistor. The second gate electrode of the second access transistor is connected to a second node that interconnects the first charge compensating circuit, the first charge holding circuit and the first access transistor. The first access transistor transmits the charges corresponding to the data between the one bit line of the bit line pair and the first charge holding circuit when the first gate electrode is activated, and discharges the charges leaking to the first charge holding circuit into the one bit line of the bit line pair when the first gate electrode is inactivated and the second gate electrode is activated. The second access transistor transmits the charges corresponding to the inverted data between the other bit line of the bit line pair and the second charge holding circuit when the first gate electrode is activated, and discharges the charges leaking to the second charge holding circuit into the other bit line of the bit line pair when the first gate electrode is inactivated and the second gate electrode is activated.

Further, according to the present invention, a semiconductor memory device has a word line, a bit line, a charge compensating circuit connected to a node to compensate for charges, and an access transistor connected between the bit line and the charge compensating circuit. The access transistor includes a pair of impurity regions provided in a main surface of a semiconductor substrate and arranged spaced apart from each other by a prescribed distance to define a channel formation region, a first gate electrode provided on the semiconductor substrate with a gate insulating film interposed therebetween to face the channel formation region, and a second gate electrode adjacent to the first gate electrode, provided on the semiconductor substrate with a gate insulating film interposed therebetween to face the channel formation region. One of the impurity regions of the access transistor is connected to the bit line and the other of the impurity regions of the access transistor is connected to the node. The first gate electrode is connected to the word line, and the second gate electrode is connected to an ON/OFF control electrode of the charge compensating circuit.

As such, according to the present invention, a memory cell is provided with a charge compensating circuit and an access transistor operative in the leakage mode. Thus, the number of bulk transistors required for one bit is restricted to two, and the refresh operation is unnecessary. As a result, it is possible to realize a semiconductor memory device that permits higher integration and larger capacity nearly equal to what is obtained with a conventional DRAM and also permits a higher-speed operation and lower power consumption since the refresh operation is unnecessary.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
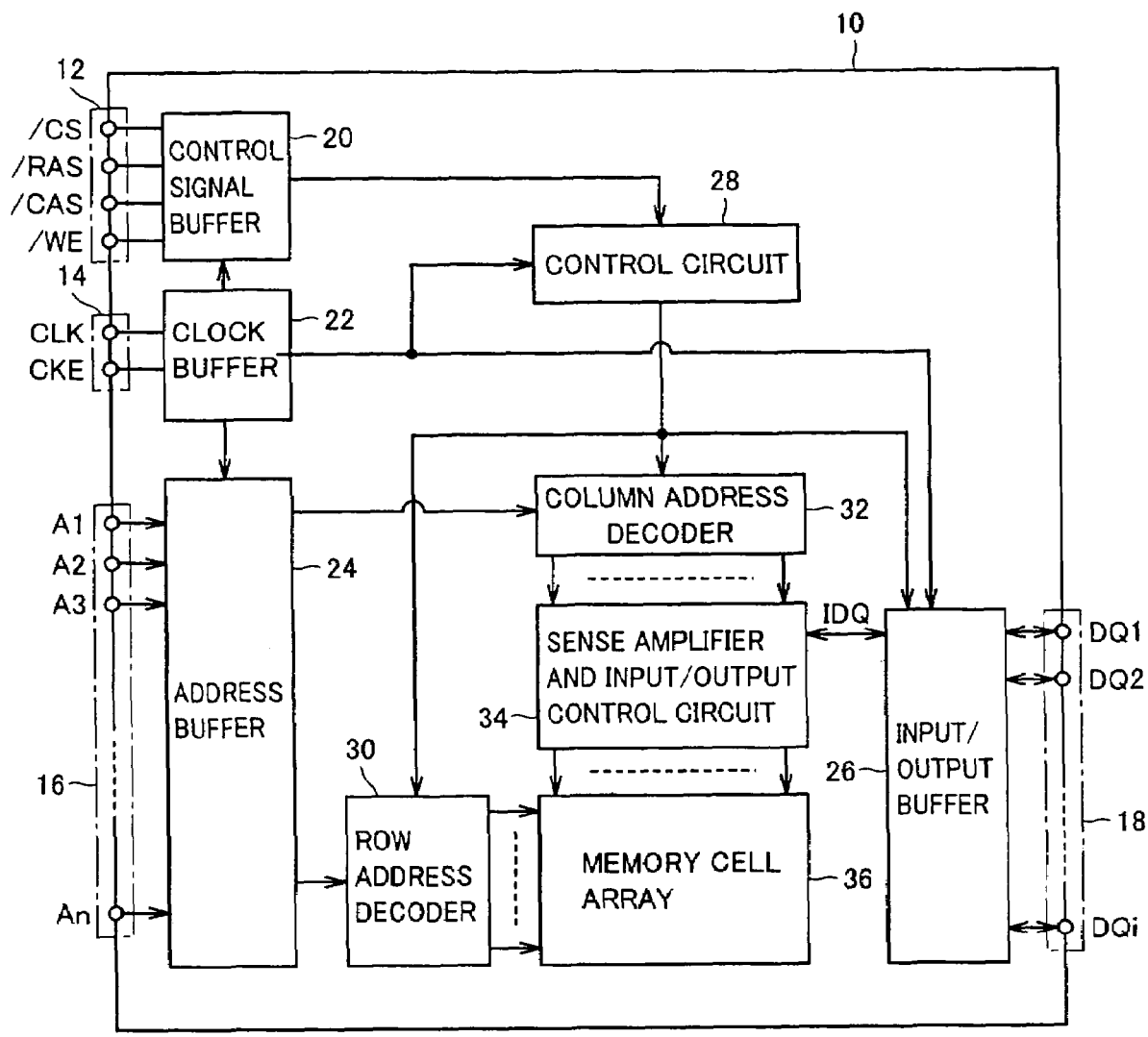
FIG. 1 is a schematic block diagram showing an overall configuration of a semiconductor memory device according to a first embodiment of the present invention.

Hereinafter, embodiments of the present invention will be described in detail with reference to the drawings. The same or corresponding portions are denoted by the same reference characters, and description thereof will not be repeated.

First Embodiment

A semiconductor memory device according to a first embodiment of the present invention is now described with reference to the drawings. Firstly, FIG. 1 shows an overall configuration of the semiconductor memory device of the present embodiment.

Referring to FIG. 1, the semiconductor memory device 10 includes a control signal terminal 12, a clock terminal 14, an address terminal 16, and a data input/output terminal 18. Semiconductor memory device 10 also includes a control signal buffer 20, a clock buffer 22, an address buffer 24, and an input/output buffer 26. Semiconductor memory device 10 further includes a control circuit 28, a row address decoder 30, a column address decoder 32, a sense amplifier and input/output control circuit 34, and a memory cell array 36.

In FIG. 1, only a main portion of semiconductor memory device 10 associated with data input/output is shown representatively.

Control signal terminal 12 receives command control signals of a chip select signal /CS, a row address strobe signal /RAS, a column address strobe signal /CAS, and a write enable signal /WE. Clock terminal 14 receives an external clock CLK and a clock enable signal CKE. Address terminal 16 receives address signals A0-An (n is a natural number).

Clock buffer 22 receives external clock CLK and generates an internal clock, and outputs the internal clock to control signal buffer 20, address buffer 24, input/output buffer 26 and control circuit 28. Control signal buffer 20 takes in and latches chip select signal /CS, row address strobe signal /RAS, column address strobe signal /CAS and write enable signal /WE in response to the internal clock received from clock buffer 22, and outputs the signals to control circuit 28. Address buffer 24 takes in and latches address signals A0-An in response to the internal clock received from clock buffer 22, and generates and outputs an internal address signal to row address decoder 30 and column address decoder 32.

Data input/output terminal 18 is for sending data read from semiconductor memory device 10 to the outside and receiving data to be written in semiconductor memory device 10 from the outside. Specifically, it receives externally input data DQ0-DQi (i is a natural number) at the time of data writing, and externally outputs data DQ0-DQi at the time of data reading.

Input/output buffer 26 takes in and latches data DQ0-DQi in response to the internal clock received from clock buffer 22 at the time of data writing, and outputs internal data IDQ to sense amplifier and input/output control circuit 34. At the time of data reading, input/output buffer 26 outputs internal data IDQ received from sense amplifier and input/output control circuit 34 to data input/output terminal 18 in response to the internal clock received from clock buffer 22.

Control circuit 28 takes in the command control signals from control signal buffer 20 in response to the internal clock received from clock buffer 22, and controls row address decoder 30, column address decoder 32 and input/output buffer 26 based on the command control signals taken in. As such, reading/writing of data DQ0-DQi with respect to memory cell array 36 is performed.

Row address decoder 30 selects a word line on memory cell array 36 corresponding to address signals A0-An based on a designation from control circuit 28, and activates the selected word line by a word driver not shown. Column address decoder 32 selects a bit line pair on memory cell array 36 corresponding to address signals A0-An, based on a designation from control circuit 28.

Sense amplifier and input/output control circuit 34, at the time of data writing, precharges the bit line pair selected by column address decoder 32 to a power supply voltage Vcc or a ground voltage GND in accordance with the logic level of internal data IDQ received from input/output buffer 26. As such, internal data IDQ is written into a memory cell on memory cell array 36 that is connected to the word line activated by row address decoder 30 and the bit line pair selected by column address decoder 32 and precharged by sense amplifier and input/output control circuit 34.

At the time of data reading, sense amplifier and input/output control circuit 34 precharges the bit line pair selected by column address decoder 32 to a ground voltage GND before the data reading. It detects and amplifies the minute voltage change generated in the selected bit line pair in response to the read data to determine the logic level of the read data, and outputs the same to input/output buffer 26.

At the time of standby where data reading/writing is not performed for memory cell array 36, sense amplifier and input/output control circuit 34 is inactivated, and all the bit line pairs are fixed to a ground potential GND.

Memory cell array 36 is a group of storage elements, formed of memory cells as will be described later, arranged in rows and columns. Memory cell array 36 is connected to row address decoder 30 via word lines corresponding to the respective rows and connected to sense amplifier and input/output control circuit 34 via bit line pairs corresponding to the respective columns.

Figure 2:
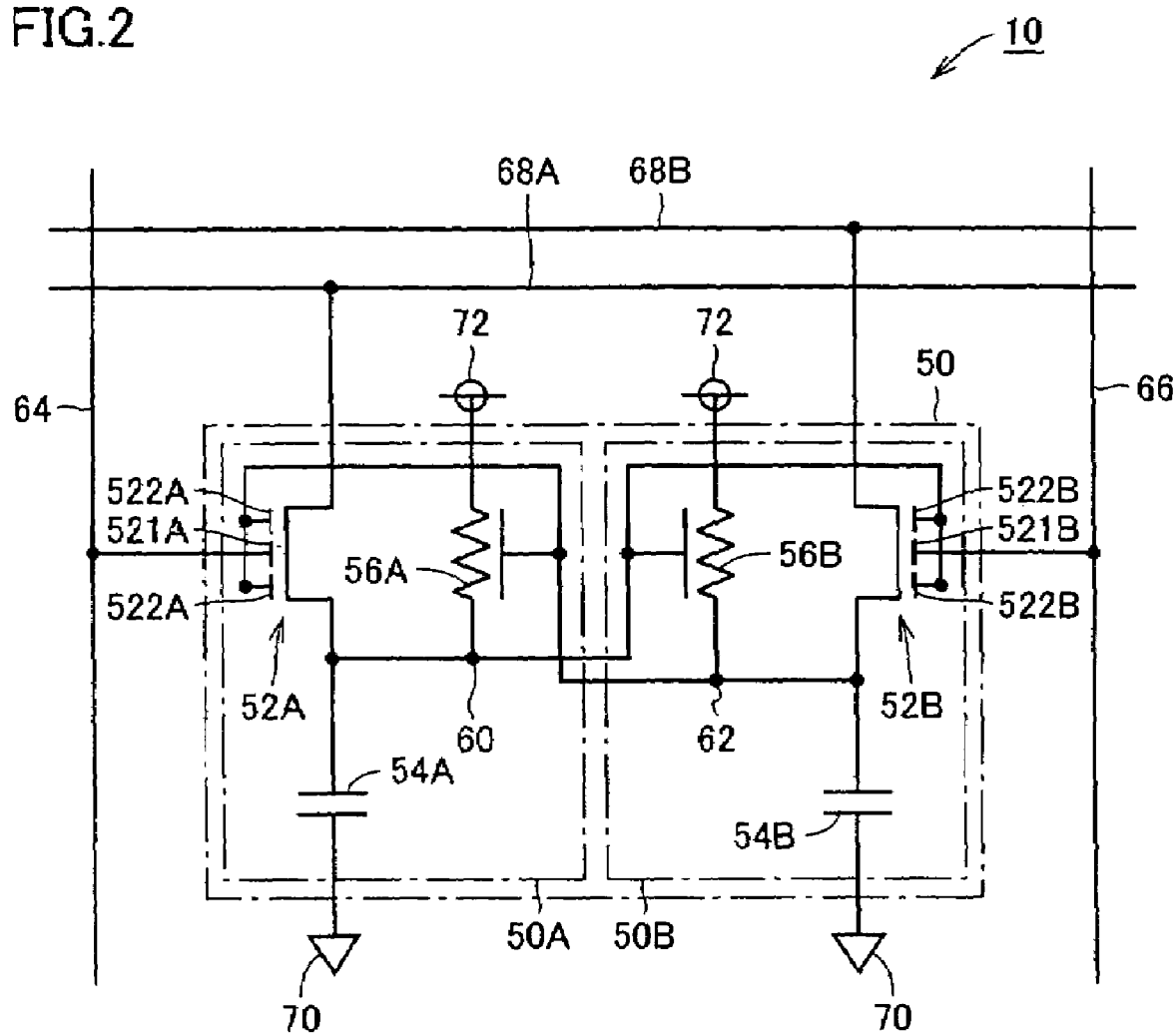
FIG. 2 is a circuit diagram showing a configuration of one of the memory cells arranged in rows and columns in the memory cell array shown in FIG. 1.

FIG. 2 shows a configuration of one of the memory cells arranged in rows and columns in memory cell array 36 shown in FIG. 1.

Referring to FIG. 2, the memory cell 50 includes two data holding portions 50A and 50B adjacent to each other in a row direction, which store data of one bit and inverted data thereof, respectively. Data holding portion 50A is formed of an access transistor 52A, a capacitor 54A and a p channel TFT 56A. Data holding portion 50B is formed of an access transistor 52B, a capacitor 54B and a p channel TFT 56B.

Access transistors 52A and 52B are n channel type MOS transistors, which have first gate electrodes 521A and 521B and second gate electrodes 522A and 522B, respectively. First gate electrodes 521A and 521B each constitute a normal gate electrode connected to a word line, while second gate electrodes 522A and 522B each function as another gate electrode in each of access transistors 52A and 52B. When a voltage is applied to second gate electrodes 522A, 522B in the state where first gate electrodes 521A, 521B are at an L (logic low) level, an incomplete channel is formed between the drain and source and a leakage current flows therebetween, which current is considerably smaller than in the state where the transistors are ON but larger than in a normal OFF state (for which detailed principle will be described later). While a current of more than about 1 µA (µ ampere) flows in a normal ON state, only a current of lower than about 10 fA flows in a normal OFF state. The leakage current (slightly ON state) herein means that a current in a range of about 1 pA to about 10 nA flows between the drain and source.

Hereinafter, the state where the first and second gate electrodes are at an L level and an H (logic high) level, respectively, is also referred to as a "leakage mode".

The structures of access transistors 52A and 52B will be described later in detail with reference to the drawings.

Access transistor 52A is connected between a bit line 68A and a node 60, and has its first gate electrode 521A connected to a word line 64. Second gate electrode 522A of access transistor 52A is connected to a node 62. Access transistor 52A turns ON when word line 64 is activated, and turns OFF when word line 64 is inactivated. When node 62 is at an H level while word line 64 is inactivated, access transistor 52A attains the leakage mode, and charges are released from node 60 to bit line 68A that is fixed to a ground potential.

Capacitor 54A stores binary information "1" or "0" according to whether charges are accumulated therein. Capacitor 54A is connected between node 60 and a cell plate 70. Charge/discharge of capacitor 54A and hence data writing is effected as a voltage corresponding to binary information "1" or "0" is applied to capacitor 54A from bit line 68A via access transistor 52A and node 60. Capacitor 54A constitutes a "first charge holding circuit".

P channel TFT 56A is connected between a power supply node 72 and node 60, and has its gate as an ON/OFF control electrode connected to node 62. P channel TFT 56A constitutes a "first charge compensating circuit" that compensates for charges leaked from capacitor 54A.

Each of P channel TFT 56A and a p channel TFT 56B as will be described later is a resistance element formed of polycrystalline silicon (polysilicon) and having a switching function. It is a high-resistance element having an OFF resistance on the order of T (tera, "T" means $10^{12}$) Ω, and an ON resistance on the order of G (giga, "G" means $10^9$) Ω. Herein, when simply a resistance element is mentioned, it refers to both one having the switching function and one having a constant resistance.

Access transistor 52B is connected between a bit line 68B constituting a pair with bit line 68A and node 62, and has first gate electrode 521B connected to a word line 66 and second gate electrode 522B connected to node 60. Access transistor 52B turns ON when word line 66 is activated and turns OFF when word line 66 is inactivated. When node 60 is at an H level while word line 66 is inactive, access transistor 52B enters a leakage mode, and charges are discharged from node 62 to bit line 68B that is fixed to a ground potential.

Capacitor 54B stores inverted data of the data stored in capacitor 54A according to whether charges are accumulated therein. Capacitor 54B is connected between node 62 and cell plate 70. When a voltage corresponding to binary information "1" or "0" is applied to capacitor 54B from bit line 68B via access transistor 52B and node 62, charge/discharge of capacitor 54B is conducted, and thus data is written therein. Capacitor 54B constitutes a "second charge holding circuit".

P channel TFT 56B is connected between a power supply node 72 and node 62, and has its gate as an ON/OFF control electrode connected to node 60. P channel TFT 56B constitutes a "second charge compensating circuit" that compensates for charges leaked from capacitor 54B.

P channel TFT 56A and 56B formed of polysilicon and capacitors 54A and 54B may be stacked and formed on top of access transistors 52A and 52B as the bulk transistors. Thus; the size of the memory cell per bit in semiconductor memory device 10 is determined approximately by the area occupied by two access transistors 52A, 52B and nodes 60, 62.

Figure 3:
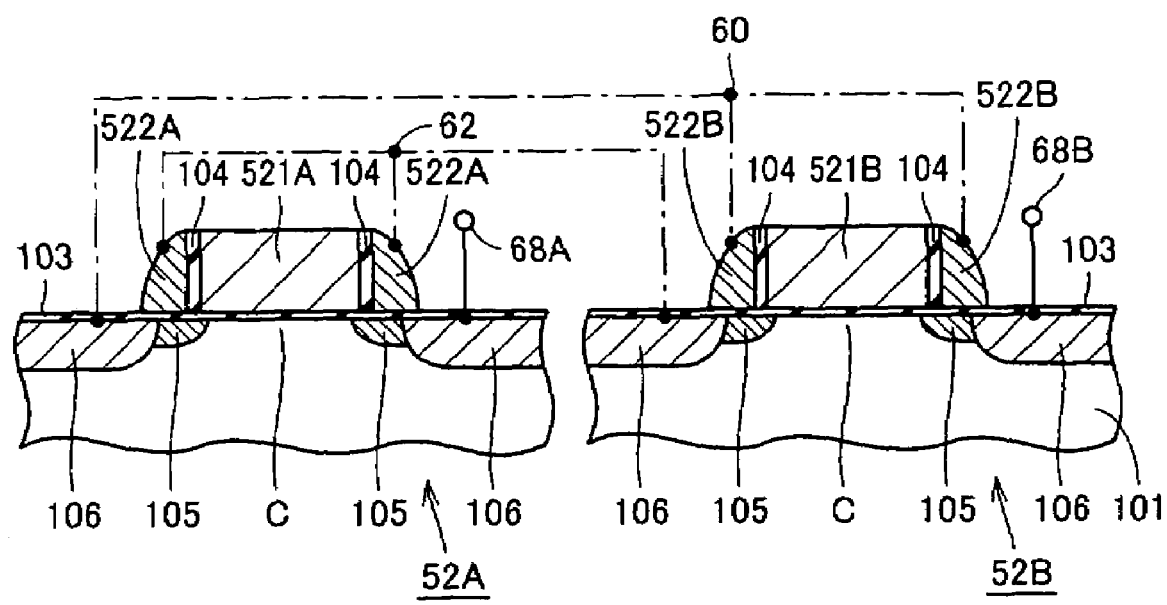
FIG. 3 is a cross-sectional view showing structures of access transistors applied to the semiconductor memory device according to the first embodiment of the present invention.

Structures of access transistors 52A, 52B shown in FIG. 2 are now described with reference to FIG. 3. FIG. 3 shows the structures of access transistors 52A, 52B in cross section.

Access transistor 52A includes a p type semiconductor substrate 101 as a semiconductor region, and a pair of source/drain regions 105, 106 provided at a main surface of semiconductor substrate 101 and spaced apart from each other by a prescribed distance to define a channel formation region C. Source/drain regions 105, 106 each have a lightly-doped-drain (LDD) structure, and include an n type low-concentration impurity region 105 and an n type high-concentration impurity region 106.

First gate electrode 521A having a rectangular shape in cross section is provided on semiconductor substrate 101 to face channel formation region C, with a gate insulating film 103 interposed therebetween. Second gate electrode 522A is provided at a sidewall region on each side of first gate electrode 521A, with an insulating film 104 interposed therebetween, to face the same channel formation region C. Second gate electrode 522A has a cross sectional shape with its width increasing as it approaches the semiconductor substrate 101 side and its outer surface sloping gently, as in the case of a sidewall insulating film formed of a common insulating film. The gate length of first gate electrode 521A is set longer than that of second gate electrode 522A.

Access transistor 52B, identical in structure to access transistor 52A, includes a pair of source/drain regions 105, 106 provided at a main surface of a p type semiconductor substrate 101. A first gate electrode 521B of a rectangular cross section is provided on semiconductor substrate 101 to face a channel formation region C, with a gate insulating film 103 interposed therebetween. At a sidewall region on each side of first gate electrode 521B, a second gate electrode 522B is provided, with an insulating film 104 interposed therebetween, to face the same channel formation region C. Second gate electrode 522B has a cross sectional shape with its width increasing as it approaches semiconductor substrate 101 and its outer surface sloping gently, as in the case of a sidewall insulating film formed of a common insulating film. The gate length of first gate electrode 521B is made longer than that of second gate electrode 522B.

Second gate electrode 522A of access transistor 52A is connected to node 62. One of source/drain regions 105, 106 is connected to node 60, and the other of source/drain regions 105, 106 is connected to bit line 68A. Second gate electrode 522B of access transistor 52B is connected to node 60. One of source/drain regions 105, 106 is connected to node 62, and the other of source/drain regions 105, 106 is connected to bit line 68B.

For access transistors 52A, 52B configured as described above, the states of channel formation regions C in the "ON state" and in the "leakage mode (slightly ON state)" are now explained with reference to FIGS. 4 and 5. The principle of operation is explained using access transistor 52A, since it is common to access transistors 52A and 52B.

Figure 4:
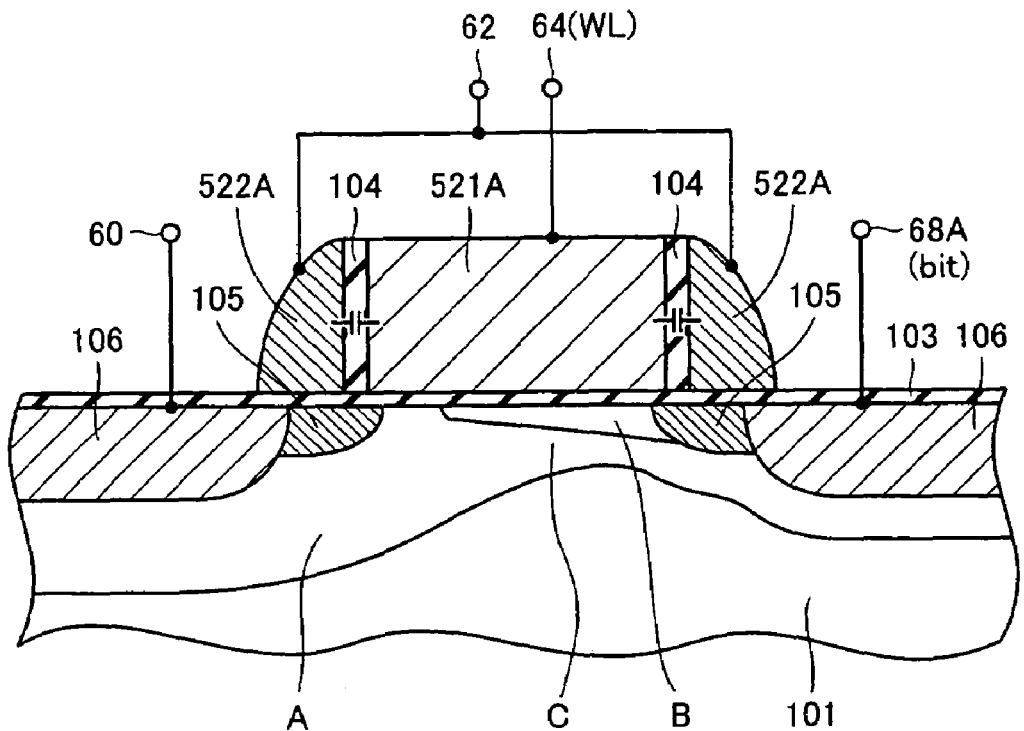
FIGS. 4 and 5 are schematic diagrams illustrating the principle of operation of the access transistor according to the first embodiment of the present invention.

FIG. 4 shows the case where word line 64 is activated (to an H level) and access transistor 52A is in the "ON state". Node 60 is at an H level, node 62 is at an L level, and bit line 68A is at an H level. In this state, a depletion layer A extends widely, and an inversion region B having its conductivity type inverted is formed in channel formation region C. As a result, the pair of source/drain regions 105, 106 is rendered conductive completely.

Figure 5:
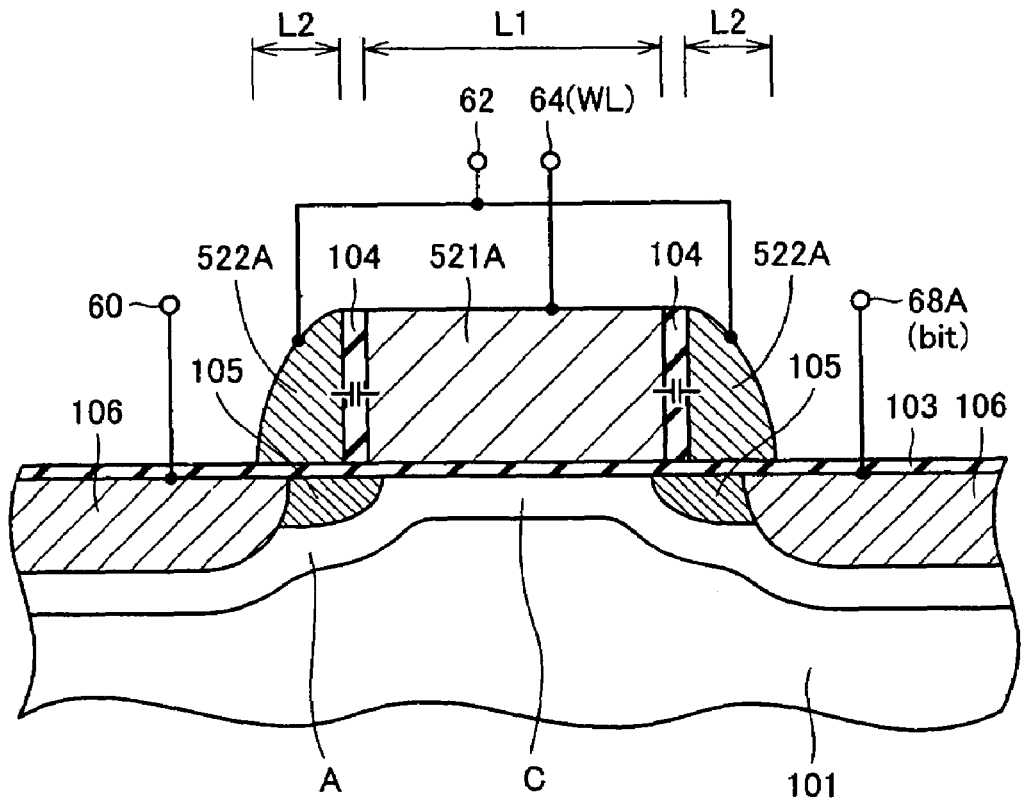

FIG. 5 shows the case where word line 64 is inactivated (to an L level) and access transistor 52A is in the "leakage mode (slightly ON state)". Node 60 is at an L level, node 62 is at an H level, and bit line 68A is at an L level. In this state, depletion layer A does not extend widely, and thus, an inversion region having its conductivity type inverted is not formed in channel formation region C. However, the voltage of node 62 is applied to channel formation region C beneath second gate electrode 522A. This affects the portion below second gate electrode 522A, and causes a leakage current. As a result, it is possible to discharge the charges from node 60 to bit line 68A that is fixed to a ground potential.

Figure 6:
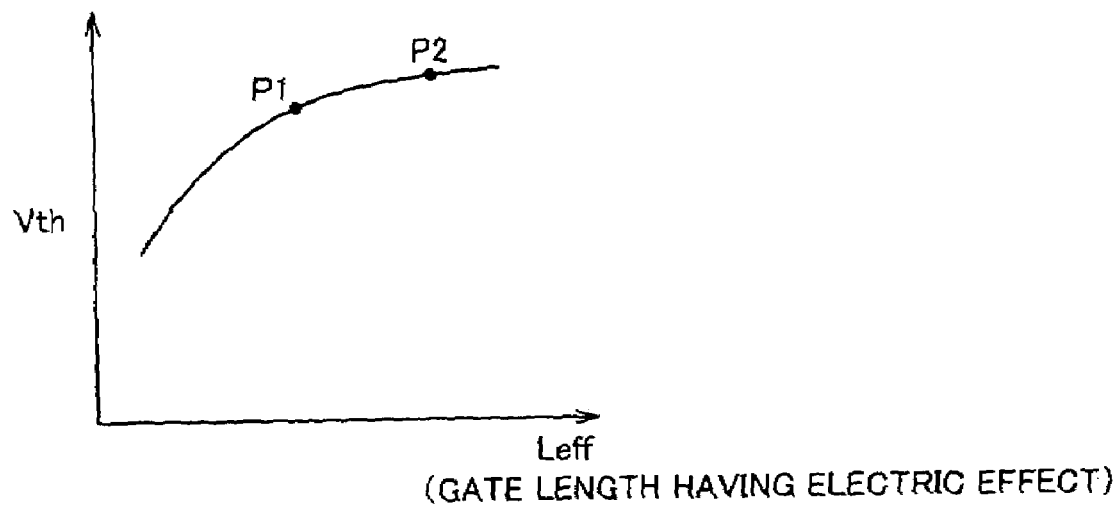
FIG. 6 shows the relation between Vth and Leff of the access transistor of the first embodiment.

FIG. 6 shows the relation between Vth (threshold voltage of access transistor 52A) and Leff (gate length of access transistor 52A having an electric effect). It is shown in this figure that when access transistor 52A is in the slightly ON state (when node 62 is at an H level), the electric field beneath second gate electrode 522A is affected by second gate electrode 522A, and thus, Leff (the gate length having an electric effect) is shortened and the threshold voltage (Vth) is decreased. More specifically, word line 64 is at the same potential level at points P1 and P2 in FIG. 6, and node 60 is also at the same potential level. The potential of node 62 is an H level at point P1 and an L level at point P2. This shows that the threshold voltage (Vth) is decreased as the Leff becomes shorter at point P1 than at point P2.

It is noted that Vth on the vertical axis of FIG. 6 is supplied from a constant current source, and corresponds to the voltage of a word line at the time when the gate width is 10 μm and the drain current is 1 μA. The gate width of an access transistor actually used is 1 μm or less.

Figure 7:
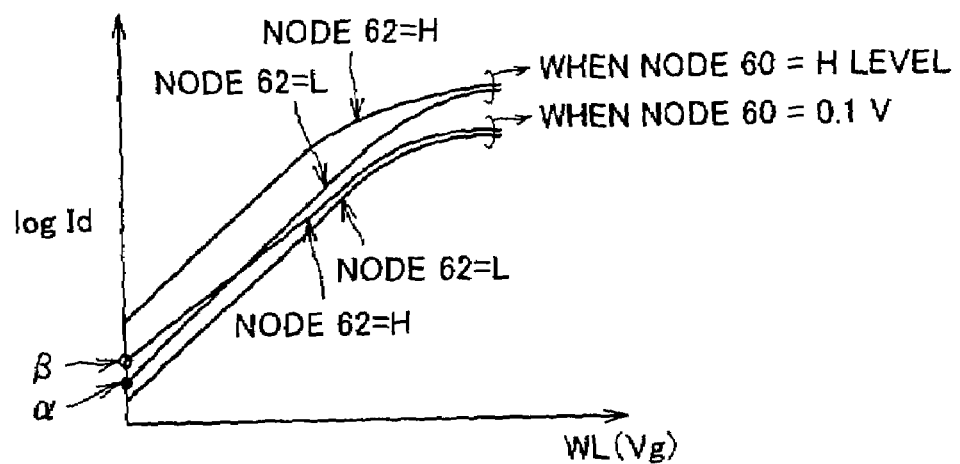
FIG. 7 shows the Vg-Id properties of the access transistor of the first embodiment.

FIG. 7 shows Vg-Id properties for showing the cell properties at the time of holding data. The case where word line 64 is at an H level, bit line 68A at an L level, node 60 at an H level and node 62 at an L level, or the case where word line 64 is at an H level, bit line 68A at an L level, node 60 at an L level and node 62 at an H level, corresponds to the time of reading. The case where word line 64 is at an L level, bit line 68A at an L level, node 60 at an H level and node 62 at an L level, or the case where word line 64 is at an L level, bit line 68A at an L level, node 60 at an L level and node 62 at an H level, corresponds to the time of holding stored data.

It is required that, when Vg is 0 V, the current amount (the point β in FIG. 7) at the time when node 60 is 0.1 V and node 62 is at an H level becomes greater than the current amount (the point α in FIG. 7) at the time when node 60 is at an H level and node 62 is at an L level. Note that node 60 is set to 0.1 V, since the current would not flow with 0 V, and the potential increase up to about 0.1 V, for example, is conceivable on the L level side. Even if the current amounts at points α and β are reversed, the potentials of the respective nodes are stable and do not cause any problems as long as the ON current of TFT is at least a hundredfold the current amount at α and the OFF current of TFT is less than a hundredfold the current amount at β. The "hundredfold" takes account of variation in manufacture.

In this manner, the data retention can be stabilized. Even if the leakage current is greater at point β than at point α, the node on the H side will not fall to L if the TFT on the load side where charges are accumulated in the storage node can supply a greater current to the storage node of H than to the storage node of L.

As described above, a current of at least about 1 μA flows in a normal ON state, a current of not more than about 10 fA flows in a normal OFF state, and a leakage current (slightly ON state) in a range of about 1 pA to about 10 nA flows between the drain and source. When node 60 is at an H level and node 62 is at an L level as shown in FIG. 4, the current amount may decrease compared to a normal state due to the influence of second gate electrode 522A. However, insulating film 104 is provided between first gate electrode 521A and second gate electrode 522A, and thus, when word line 64 attains an H level, the potential of second gate electrode 522A is raised by capacitive coupling. As such, it is considered that the current is not likely to decrease even if the potential of second gate electrode 522A is at an L level.

To realize an effective "leakage mode (slightly ON state)", it would be preferable to set the gate length (L2) of second gate electrode 522A to about 0.04 μm to about 0.1 μm when the gate length (L1) of first gate electrode 521A is about 0.2 μm (see FIG. 5).

An operation of the memory cell is now described with reference to FIG. 2 again.

(1) Data Writing

It is assumed that the case where charges are accumulated in capacitor 54A and not in capacitor 54B corresponds to data "1". When data "1" is to be written, bit lines 68A and 68B are precharged to a power supply potential Vcc and a ground potential GND, respectively, and word lines 64 and 66 are activated. As such, access transistors 52A and 52B are turned ON, and the voltage of power supply potential Vcc is applied from bit line 68A through access transistor 52A and node 60 to capacitor 54A, and thus, charges are accumulated in capacitor 54A. The voltage of ground potential GND is applied from bit line 68B through access transistor 52B and node 62 to capacitor 54B, and thus, charges are discharged from capacitor 54B to bit line 68B.

Since data holding portions 50A and 50B are identical in circuit configuration, when data "0" is to be written, operations similar to those described above are performed, only with the operations of data holding portions 50A and 50B replaced with each other, and thus, description thereof is not repeated here.

(2) Data Retention

In this memory cell 50, the ON and OFF currents of p channel TFT 56A, 56B are on the order of $1 \times 10^{-11}$ A and $1 \times 10^{-13}$ A, respectively. The leakage currents from nodes 60, 62 due to the OFF currents (not in the leakage mode) of the access transistors as bulk transistors are on the order of $1 \times 10^{-15}$ A. As such, the ON currents of p channel TFT 56A, 56B exceed the leakage currents from nodes 60, 62 each by four digits, and accordingly, it is possible to charge nodes 60, 62 and capacitors 54A, 54B connected thereto from power supply node 72.

It is noted that the respective current values shown here only indicate the orders thereof, and they are not limited thereto.

The OFF currents of p channel TFT 56A, 56B also exceed the leakage currents from nodes 60, 62. Since memory cell 50 is unprovided with a driver transistor for releasing the charges of node and capacitor at an L level as in a conventional SRAM, the potential of the node at the L level would increase and the stored data would be destroyed if another measure were not taken.

In memory cell 50, however, in the leakage mode, the charges of the node at an L level are discharged to a corresponding bit line through the access transistor, and thus, the stored data can be held. Hereinafter, the case where data "1" is being held is described in detail.

At the time of holding data, bit lines 68A and 68B are fixed to a ground potential, and word lines 64 and 66 are inactivated. After data "1" is written, capacitor 54A and node 60 are in a charged state (an H level), and capacitor 54B and node 62 are in a discharged state (an L level). Here, although access transistor 52A is OFF, a current of about $1 \times 10^{-15}$ A flows as described above, and the charges accumulated in capacitor 54A and node 60 leak through access transistor 52A.

The decrease of the charges due to the leakage, however, is compensated for from p channel TFT 56A in the ON state. The ON current of p channel TFT 56A, i.e., the charged current, is on the order of $1 \times 10^{-11}$ A, which exceeds the OFF current of access transistor 52A, i.e., the discharged current, by four digits, as described above. Accordingly, the charged states of capacitor 54A and node 60 are maintained.

It is preferable that the charged current by p channel TFT 56A exceeds the discharged current by access transistor 52A by at least one digit. If the charged current is n times (n is less than 10) the discharged current, the potential of the node at the H level will decrease by $1/(1+n)$ Vcc, which is not negligible.

Access transistor 52B is in the leakage mode, since node 60 is at an H level. The charges leaked from power supply node 72 via p channel TFT 56B in the OFF state to node 62 are leaked to bit line 68B via access transistor 52B. Here, to prevent an increase of the potentials of capacitor 54B and node 62, the leakage current of access transistor 52B in the leakage mode should be greater than the OFF current of p channel TFT 56B. In this memory cell 50, the leakage current of access transistor 52B in the leakage mode is on the order of $1 \times 10^{-11}$ A, which is greater than the OFF current $1 \times 10^{-13}$ A of p channel TFT 56B, and thus, the discharged states of capacitor 54B and node 62 are maintained. As such, memory cell 50 can hold data "1".

It is preferable that the leakage current of access transistor 52B in the leakage mode exceeds the OFF current of p channel TFT 56B by at least one digit; otherwise, the potential increases of capacitor 54B and node 62 will become considerable.

For retention of data "0", the above-described operations of data holding portions 50A and 50B are just replaced with each other. The operations in themselves are similar to those as described above, and thus, description thereof is not repeated.

Although it has been described that the potentials of bit lines 68A and 68B are fixed to a ground potential at the time of holding data, not limited to the ground potential, they may be fixed to, e.g., a negative potential.

(3) Data Reading

It is assumed that memory cell 50 stores data "1". Bit lines 68A and 68B are precharged to a ground potential in advance. Word lines 64 and 66 are activated at the time of data reading. In response, access transistors 52A and 52B turn ON, and charges are discharged from capacitor 54A in the charged state through access transistor 52A to bit line 68A, so that the potential of bit line 68A increases.

The potential of bit line 68B remains at a ground potential, since capacitor 54B is in a discharged state. Thus, there occurs a potential difference between bit lines 68A and 68B. The potential difference is compared by a sense amplifier not shown, and the potential of bit line 68A is amplified to a power supply potential Vcc. The state where the potentials of bit lines 68A and 68B correspond to a power supply potential Vcc and a ground potential GND, respectively, is correlated with data "1", and thus, data "1" is read.

When the data is read, word lines 64 and 66 are activated again with the potentials of bit lines 68A and 68B being a power supply potential Vcc and ground potential GND, respectively. Access transistors 52A and 52B turn ON, and charges are recharged from bit line pair 68A, 68B through access transistors 52A, 52B to capacitors 54A, 54B, respectively, so that the stored data destroyed upon data reading are rewritten.

For reading of data "0", the similar operations as described above are performed, with the operations of data holding portions 50A and 50B being replaced with each other. Thus, description thereof is not repeated.

Hereinafter, a method of manufacturing access transistors 52A, 52B shown in FIG. 3 is described with reference to FIGS. 8-11. Since access transistors 52A and 52B are manufactured in the same manner, description is made for access transistor 52A.

Figure 8:
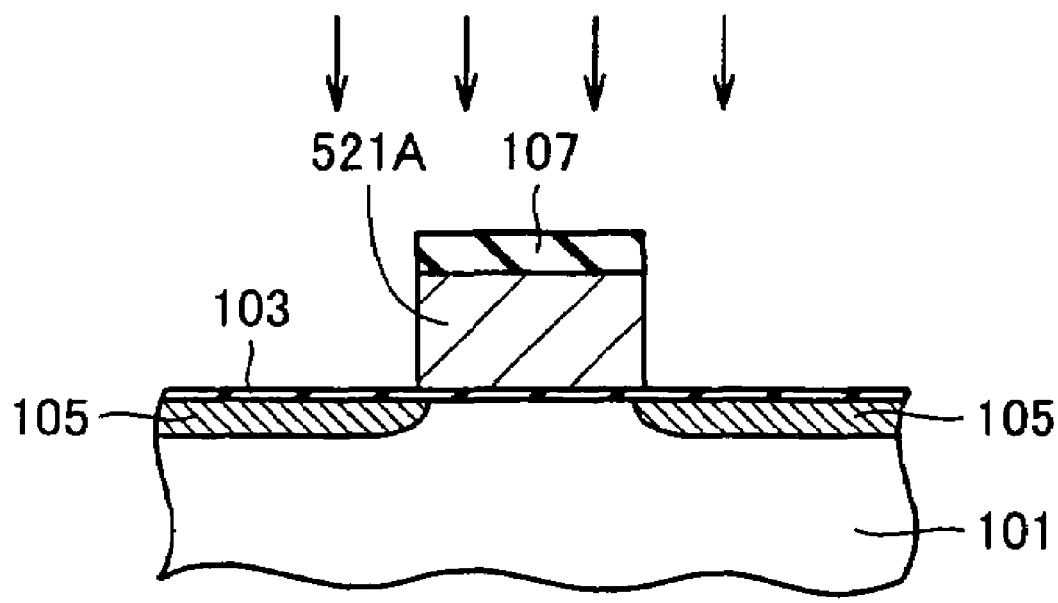
FIGS. 8-11 are cross sectional views illustrating first through fourth steps of the manufacturing process of the access transistor according to the first embodiment.

Referring to FIG. 8, a gate insulating film 103 of silicon oxide film or silicon nitrided and oxidized film is formed on a main surface of p type semiconductor substrate 101, to have a thickness of about 25 Å to about 50 Å. Thereafter, a first gate electrode 521A is formed, with a silicon oxide film 107 on its upper surface. First gate electrode 521A has a two-layer structure, with a polysilicon layer having a thickness of about 250 Å to about 500 Å as a lower layer and a silicide layer having a thickness of about 250 Å to about 500 Å as an upper layer, although not shown. N type impurity is then introduced into the main surface of semiconductor substrate 101, using silicon oxide film 107 and first gate electrode 521A as masks, to form a low-concentration impurity region 105 having an impurity concentration of about $1 \times 10^{11}$ cm$^3$ to about $1 \times 10^{19}$ cm$^3$.

Figure 9:
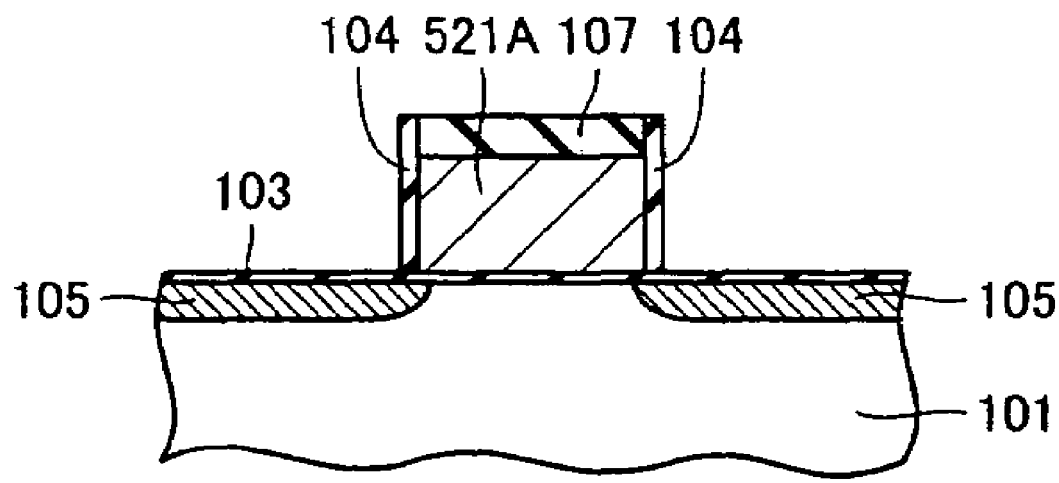

Next, referring to FIG. 9, an insulating film 104 of silicon oxide film or silicon nitrided and oxidized film having a thickness of about 25 Å to about 50 Å is formed on each side surface of first gate electrode 521A.

Figure 10:
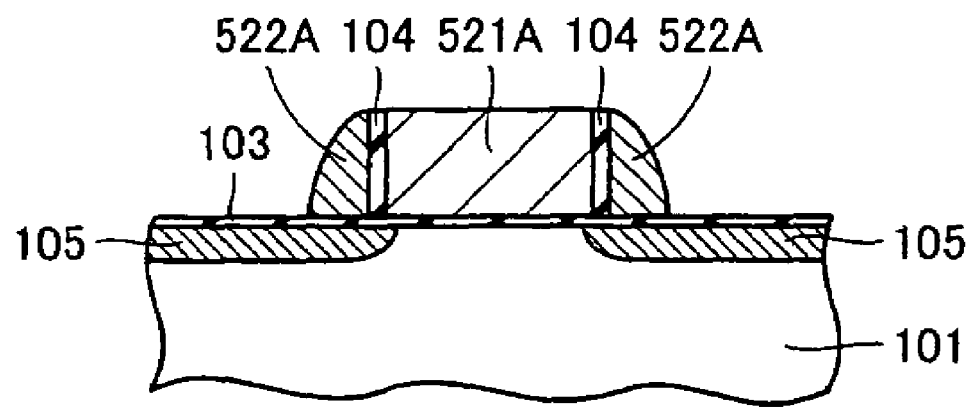

Referring to FIG. 10, a second gate electrode 522A covering insulating film 104 is formed on each side of first gate electrode 521A. Second gate electrode 522A is made of polysilicon containing n type impurity (e.g., phosphorus) with an impurity concentration of about $1 \times 10^{20}$ cm$^3$, and is about 500 Å to about 1000 Å in height and about 0.04 μm to about 0.1 μm in width (gate length).

Figure 11:
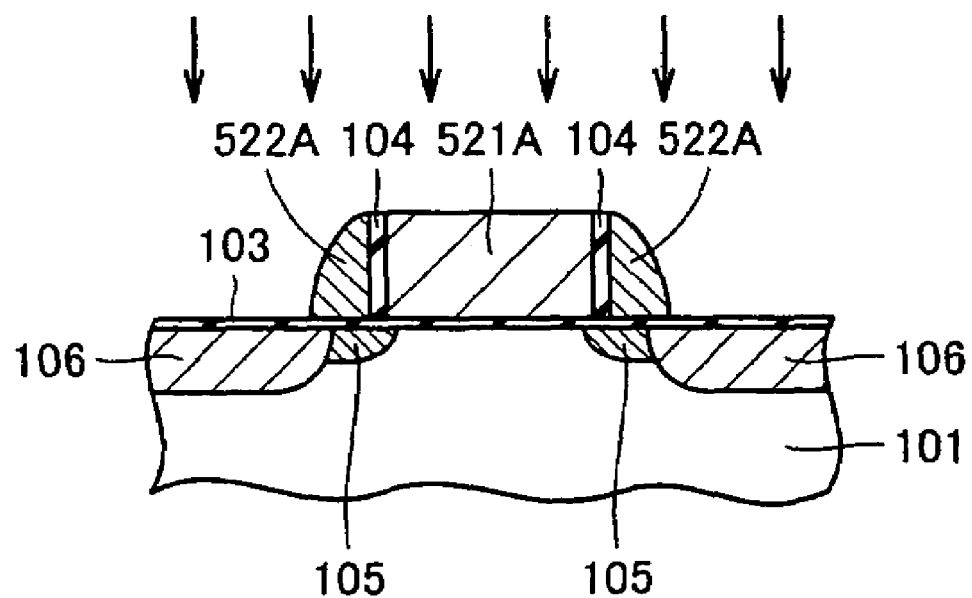

Next, referring to FIG. 11, n type impurity is introduced into the main surface of semiconductor substrate 101, using first gate electrode 521A and second gate electrode 522A as masks, to form a high-concentration impurity region 106 with an impurity concentration of about $1 \times 10^{20}$ cm$^3$.

As such, access transistor 52A shown in FIG. 3 is completed. Access transistor 52B is formed in the same manner.

Although it has been described that data holding portions 50A and 50B are arranged adjacent to each other in a row direction, the memory cell may be configured to have data holding portions 50A and 50B arranged adjacent to each other in a column direction.

Figure 12:
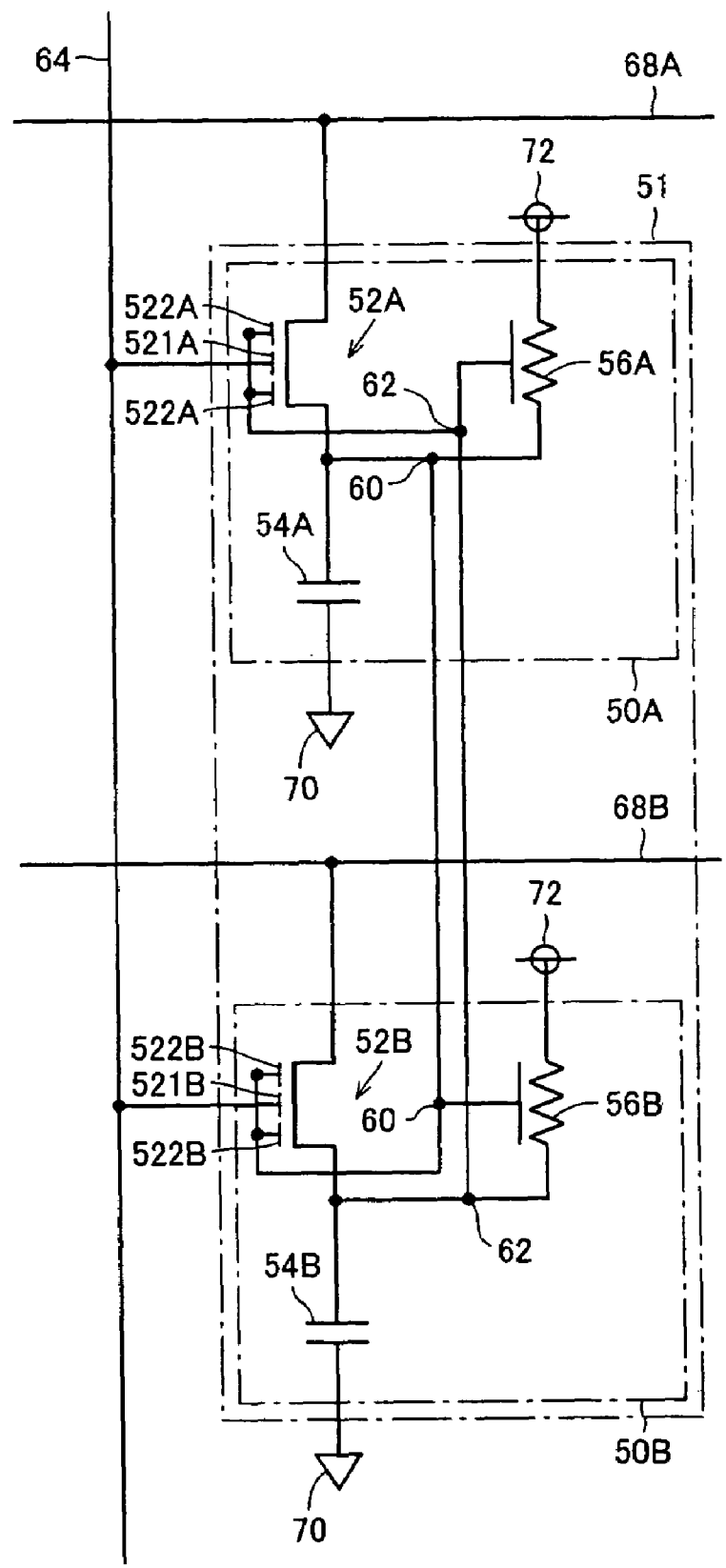
FIG. 12 is a circuit diagram showing another configuration of one of the memory cells arranged in rows and columns in the memory cell array shown in FIG. 1.

FIG. 12 shows another configuration of one of the memory cells arranged in rows and columns in memory cell array 36 shown in FIG. 1.

Referring to FIG. 12, two data holding portions 50A and 50B constituting a memory cell 51 are arranged adjacent to each other in a column direction, and data holding portions 50A and 50B are connected to a common word line 64. Data holding portion 50B stores inverted data of the data stored in data holding portion 50A. Otherwise, the configuration of the memory cell shown in FIG. 12 is identical to that of the memory cell shown in FIG. 2.

The memory cell with this configuration can function in the same manner as the memory cell shown in FIG. 2. With this configuration, one memory cell requires only one word line, and thus, it is possible to relax the wiring pitch and others in memory cell array 36 having a plurality of memory cells arranged in rows and columns.

As described above, according to the semiconductor memory device 10 of the first embodiment, the memory cell is configured to have p channel TFT 56A and 56B operating as the charge compensating circuits and access transistors 52A and 52B operative in the leakage mode. The number of bulk transistors required for one bit is limited to two, and the refresh operation is unnecessary. Accordingly, it is possible to realize a semiconductor memory device permitting higher integration and larger capacity close to the levels of a conventional DRAM and also permitting higher-speed operation and lower power consumption with no refresh operation required.

Second Embodiment

A semiconductor memory device according to a second embodiment of the present invention is now described with reference to the drawings. The features of the present embodiment reside in the structures of access transistors 52A, 52B as semiconductor elements that are applied to memory cell 50 of semiconductor memory device 10 shown in FIG. 1. The principle of operation of access transistors 52A, 52B is as in the first embodiment. Thus, description is now made only for the structures of access transistors 52A and 52B and a manufacturing method thereof according to the present embodiment.

Figure 13:
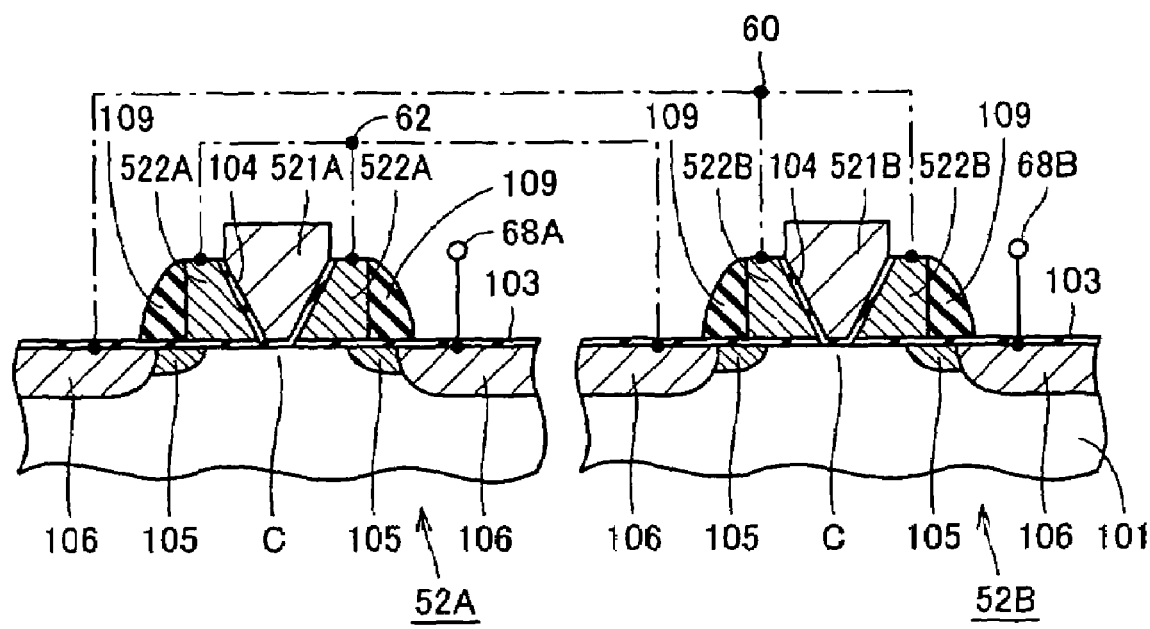
FIG. 13 is a cross sectional view showing structures of access transistors applied to a semiconductor memory device according to a second embodiment of the present invention.

Referring to FIG. 13, the structures of access transistors 52A, 52B of the present embodiment are described. The same or corresponding portions with those of the access transistors in the first embodiment are denoted by the same reference characters, and description thereof is not repeated.

The characteristic configuration of access transistor 52A of the present embodiment is that first gate electrode 521A is provided which has an approximately V shape in cross section, with its side surfaces sloped such that the width of access transistor 52A decreases as it approaches semiconductor substrate 101, and that second gate electrode 522A is provided on a sidewall portion on each side of first gate electrode 521A with an insulating film 104 interposed therebetween. Second gate electrode 522A has a cross sectional shape in which its surface facing first gate electrode 521A is sloped to follow the shape of first gate electrode 521A and its width increases as it approaches semiconductor substrate 101. The gate length of first gate electrode 521A is made shorter than that of second gate electrode 522A.

As a result, compared to the access transistor 52A in the first embodiment, second gate electrode 522A of the present embodiment has a larger region facing channel formation region C. Further, a sidewall insulating film 109 made of an insulating film is provided on a side surface of second gate electrode 522A. The structure of access transistor 52B is identical to that of access transistor 52A.

In these access transistors 52A and 52B, again, second gate electrode 522A of access transistor 52A is connected to node 62, one of source/drain regions 105, 106 is connected to node 60, and the other of source/drain regions 105, 106 is connected to bit line 68A. Second gate electrode 522B of access transistor 52B is connected to node 60, one of source/drain regions 105, 106 is connected to node 62, and the other of source/drain regions 105, 106 is connected to bit line 68B.

A method of manufacturing access transistors 52A, 52B shown in FIG. 13 is now described with reference to FIGS. 14-20. Since access transistors 52A and 52B are made in the same manner, description is made only for access transistor 52A.

Figure 14:
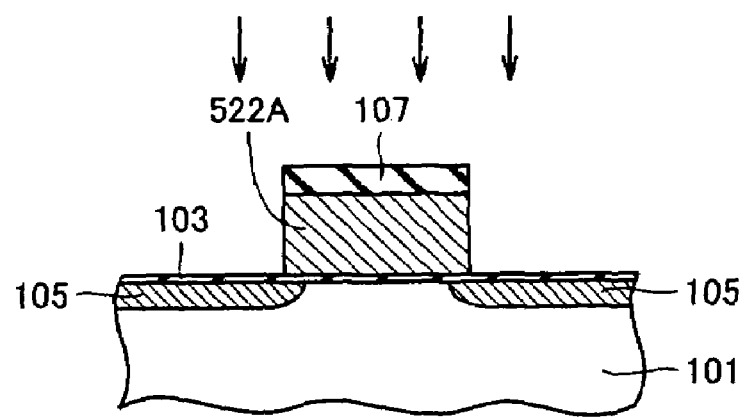
FIGS. 14-20 are cross sectional views illustrating first through seventh steps of the manufacturing process of the access transistor according to the second embodiment.

Referring to FIG. 14, a gate insulating film 103 of silicon oxide film or silicon nitrided and oxidized film is formed on a main surface of p type semiconductor substrate 101 to a thickness of about 25 Å to about 50 Å. A second gate electrode 522A is then formed, with a silicon oxide film 107 on its upper surface. Second gate electrode 522A is made of polysilicon containing n type impurity (e.g., phosphorus) with an impurity concentration of about $1 \times 10^{20}$ cm$^3$.

Figure 15:
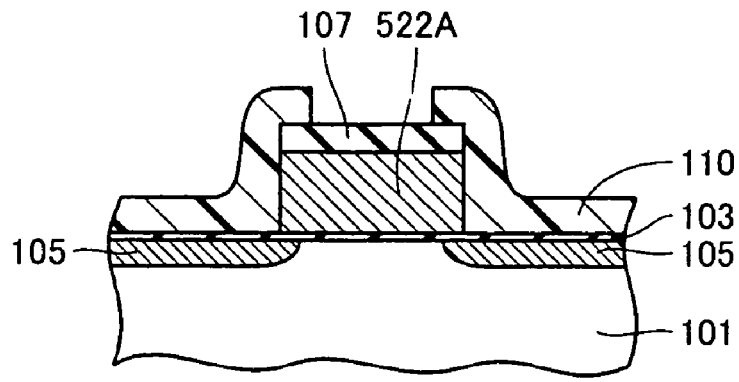
Figure 16:
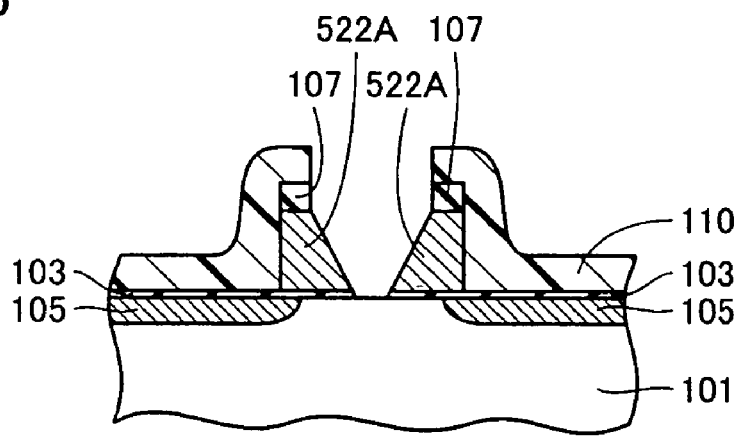

Referring to FIG. 15, a resist film 110 is formed on upper surfaces of silicon oxide film 107 and gate insulating film 13. Resist film 110 has an opening at the center on top of second gate electrode 522A. Thereafter, referring to FIG. 16, silicon oxide film 107, second gate electrode 522A and gate insulating film 103 are etched, using resist film 110 as a mask. At this time, anisotropic etching is conducted such that the opening width of second gate electrode 522A decreases as it approaches the substrate side (so that the etched end surfaces are tapered).

Figure 17:
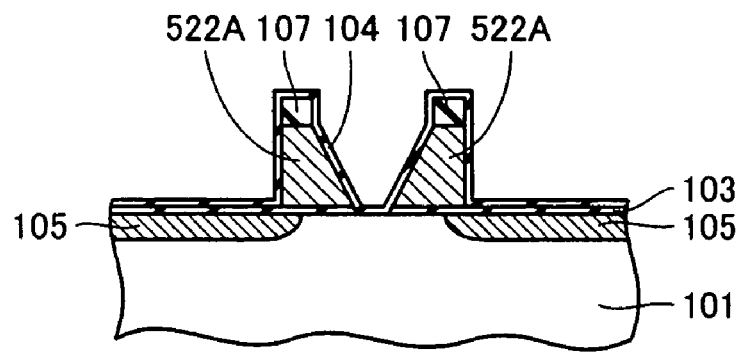

Next, referring to FIG. 17, after removal of resist film 110, an insulating film 104 of silicon oxide film or silicon nitrided and oxidized film is formed to cover all the exposed surfaces, to a thickness of about 25 Å to about 50 Å.

Figure 18:
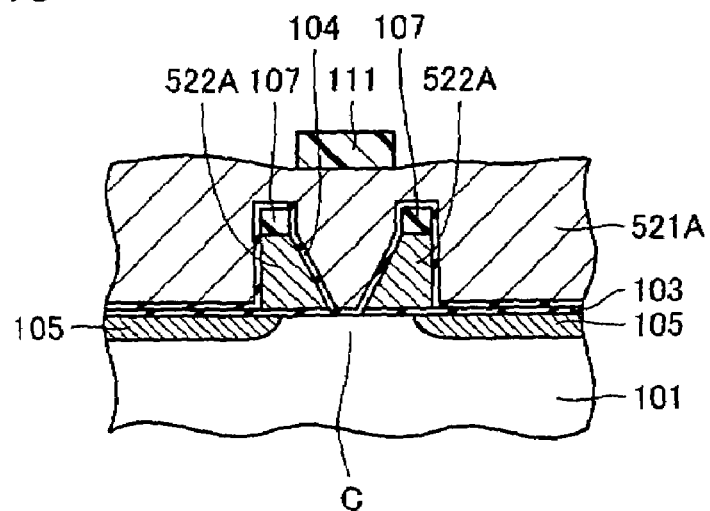
Figure 19:
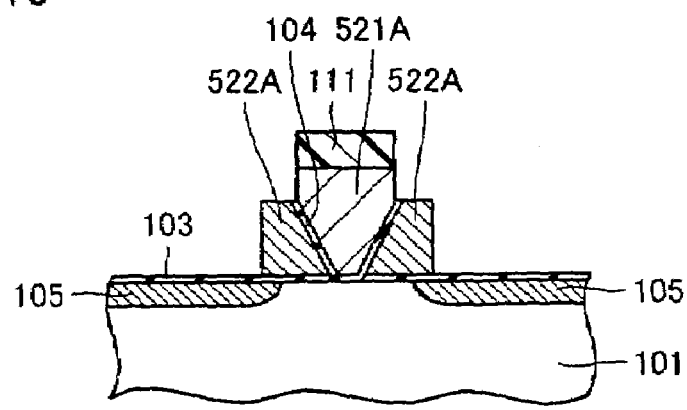
Figure 20:
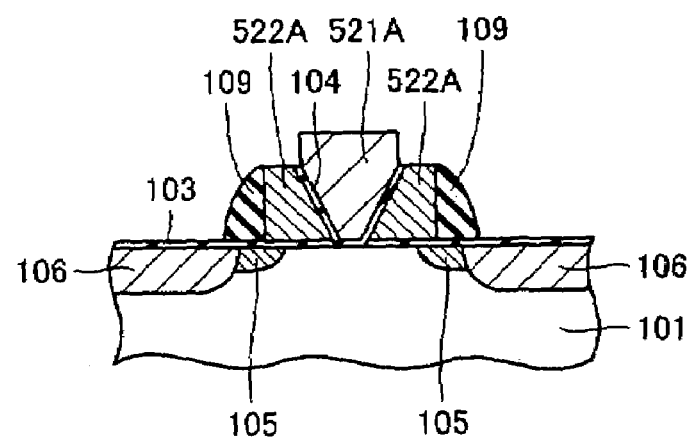

Referring to FIG. 18, a first gate electrode 521A is then formed to entirely cover insulating film 104. First gate electrode 521A has a two-layer structure, with a polysilicon layer having a thickness of about 250 Å to about 500 Å as a lower layer and a silicide layer having a thickness of about 250 Å to about 500 Å as an upper layer. Thereafter, a resist film 111 for patterning first gate electrode 521A is formed on an upper surface of first gate electrode 521A, above channel formation region C.

First gate electrode 521A is pattered using resist film 111 as a mask, and the exposed insulating film 104 is removed. Thereafter, n type impurity is introduced into the main surface of semiconductor substrate 101 with resist film 111 and second gate electrode 522A as masks, to form a low-concentration impurity region 105 having an impurity concentration of about $1 \times 10^{11}$ cm$^3$ to about $1 \times 10^{19}$ cm$^3$.

Next, a sidewall insulating film 109 of silicon oxide film or silicon nitrided and oxidized film is formed on a sidewall portion of second gate electrode 522A. Thereafter, n type impurity is introduced into the main surface of semiconductor substrate 101, using first gate electrode 521A, second gate electrode 522A and sidewall insulating film 109 as masks, to form a high-concentration impurity region 106 with an impurity concentration of about $1 \times 10^{20}$ cm$^3$.

As such, access transistor 52A shown in FIG. 13 is completed. Access transistor 52B is formed in the same manner.

The semiconductor memory device employing access transistors 52A and 52B configured as above can also enjoy operational effects similar to those of the semiconductor memory device of the first embodiment described above.

Further, in the present embodiment, sidewall insulating film 109 is formed of a normal insulating film. This sidewall insulating film 109 serves as a protective film, which can prevent occurrence of short circuit between a contact connected to high-concentration impurity region 106 or the like and first and second gate electrodes 521A and 522A Third Embodiment A semiconductor memory device according to a third embodiment of the present invention is now described with reference to the drawings. The characteristic features of the present embodiment reside in the structures of access transistors 52A, 52B as semiconductor elements employed for memory cell 50 of semiconductor memory device 10 shown in FIG. 1. The principle of operation of access transistors 52A, 52B of the present embodiment is the same as in the first embodiment. Thus, description is now made only for the structures of access transistors 52A, 52B and a manufacturing method thereof according to the present embodiment.

The structures of access transistors 52A, 52B of the present embodiment are described with reference to FIG. 21. The same or corresponding portions with access transistors 52A, 52B of the first embodiment are denoted by the same reference characters, and description thereof is not repeated.

Access transistor 52A of the present embodiment is characterized in that only one sidewall portion of first gate electrode 521A having a rectangular shape in cross section is provided with second gate electrode 522A of a cross sectional shape extending to cover a sidewall insulating film 112 and partly cover an upper surface of first gate electrode 521A. The gate length of first gate electrode 521A is made longer than that of second gate electrode 522A. The structure of access transistor 52B is identical to that of access transistor 52A.

In these access transistors 52A and 52B, second gate electrode 522A of access transistor 52A is connected to node 60, one of source/drain regions 105, 106 is connected to node 62, and the other of source/drain regions 105, 106 is connected to bit line 68A. Second gate electrode 522B of access transistor 52B is connected to node 62, one of source/drain regions 105, 106 is connected to node 60, and the other of source/drain regions 105, 106 is connected to bit line 68B.

Figure 21:
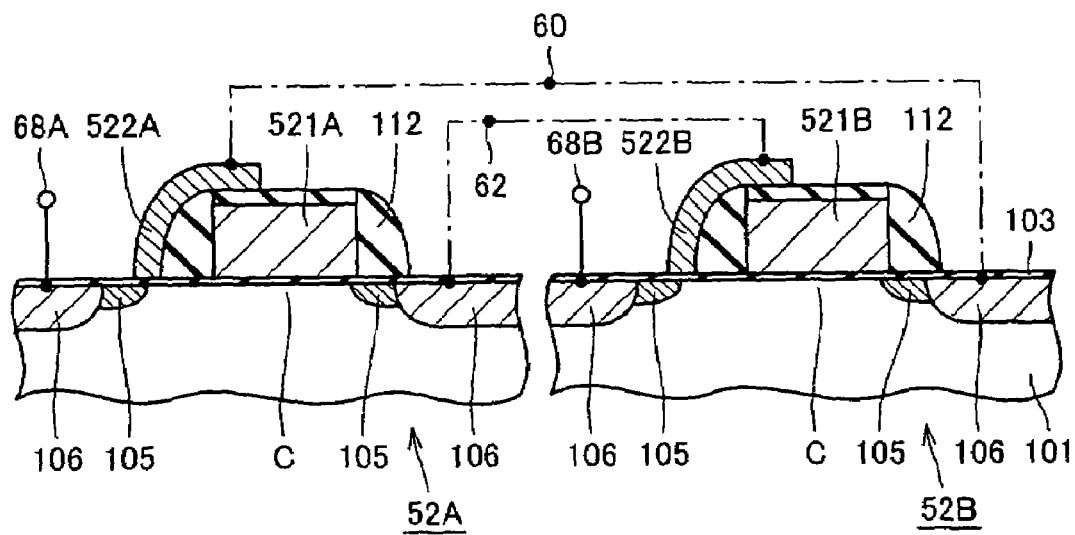
FIG. 21 is a cross sectional view showing structures of access transistors applied to a semiconductor memory device according to a third embodiment of the present invention.

A manufacturing method of access transistors 52A, 52B shown in FIG. 21 is now described with reference to FIGS.

22-26. Since access transistors 52A and 52B are manufactured in the same manner, description is made only for access transistor 52A.

Figure 22:
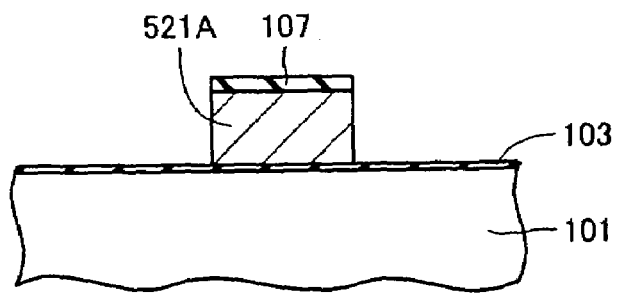
FIGS. 22-26 are cross sectional views illustrating first through fifth steps of the manufacturing process of the access transistor according to the third embodiment.

Referring to FIG. 22, a gate insulating film 103 of silicon oxide film or silicon nitrided and oxidized film is formed on a main surface of p type semiconductor substrate 101 to have a thickness of about 25 Å to about 50 Å. Thereafter, a first gate electrode 521A having a silicon oxide film 107 on its upper surface is formed. First gate electrode 521A has a two-layer structure, with a polysilicon layer of a thickness of about 250 Å to about 500 Å as a lower layer and a silicide layer of a thickness of about 250 Å to about 500 Å as an upper layer.

Figure 23:
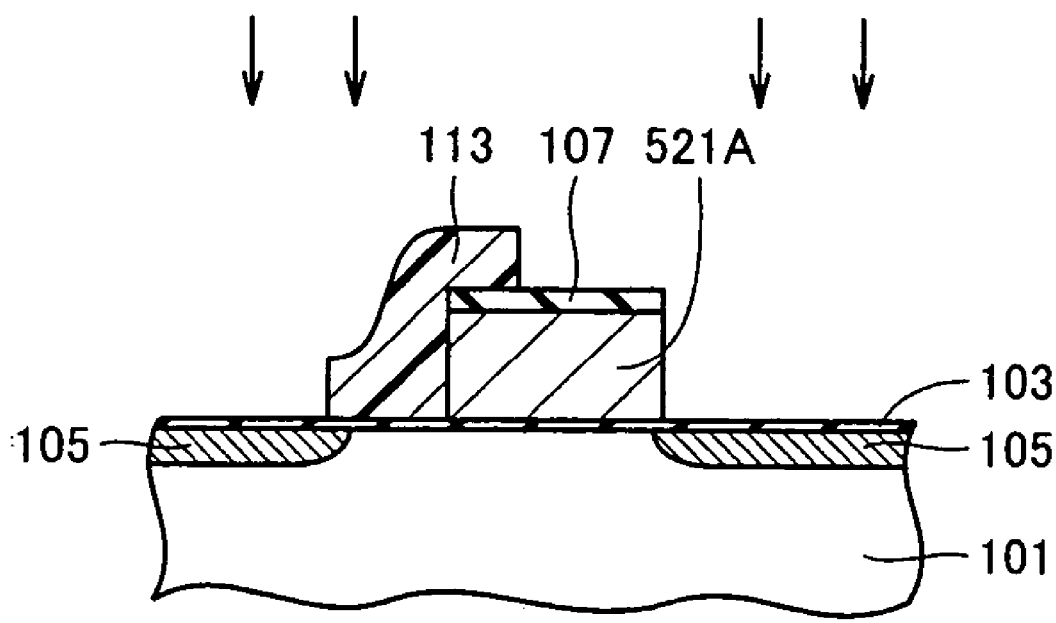

Referring to FIG. 23, a resist film 113 is formed on one side surface side of first gate electrode 521A and on the main surface of semiconductor substrate 101 extending continuously from the relevant side surface of first gate electrode 521A. Thereafter, n type impurity is introduced into the main surface of semiconductor substrate 101 with first gate electrode 521A and resist film 113 as masks, to form a low-concentration impurity region 105 having an impurity concentration of about $1 \times 10^{11}$ cm$^3$ to about $1 \times 10$ cm$^3$.

Figure 24:
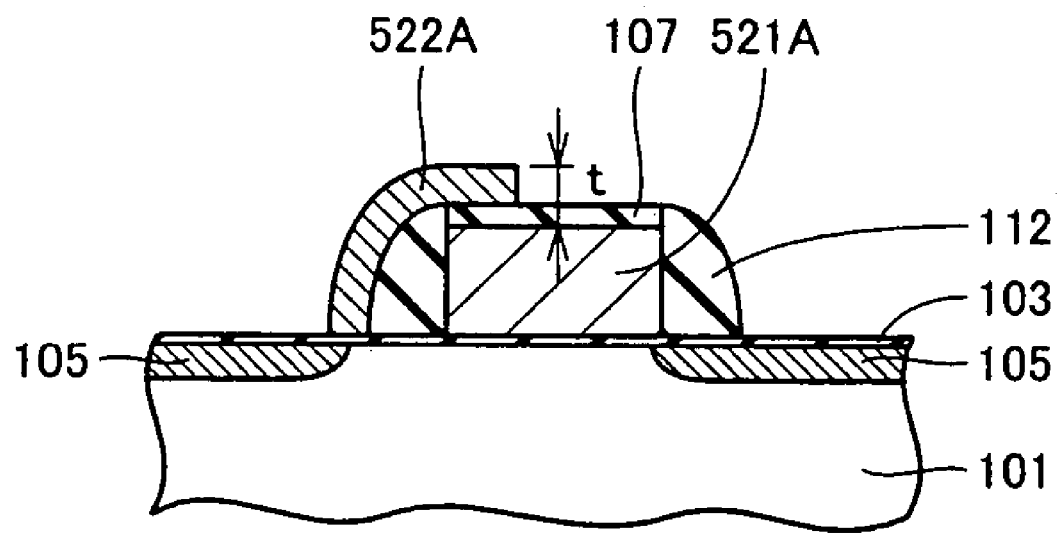

Next, referring to FIG. 24, after removal of resist film 113, a sidewall insulating film 112 of silicon oxide film or silicon nitrided and oxidized film is formed on a sidewall on each side of first gate electrode 521A. Thereafter, a second gate electrode 522A is formed to cover sidewall insulating film 112 on one side that corresponds to the side where resist film 113 was formed, as well as a portion of the main surface of semiconductor substrate 101. Second gate electrode 522A is made of polysilicon containing n type impurity (e.g., phosphorus) with an impurity concentration of about $1 \times 10^{20}$ cm$^3$ and formed to have a thickness (t) of about 500 Å to about 2000 Å.

Figure 25:
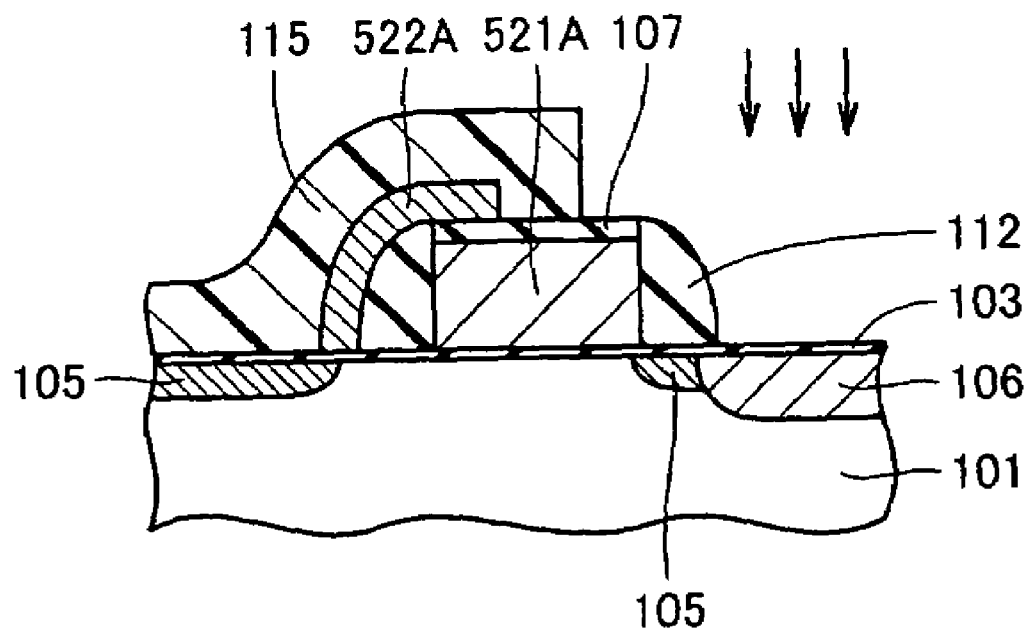

Next, referring to FIG. 25, a resist film 115 is formed to continuously cover a portion of an upper surface of first gate electrode 521A, second gate electrode 522A and the main surface of semiconductor substrate 101 extending on the relevant side. Thereafter, using this resist film 115 as a mask, n type impurity is introduced into the main surface of semiconductor substrate 101 to form a high-concentration impurity region 106 with an impurity concentration of about $1 \times 10^{20}$ cm$^3$ only in the region on one side.

Figure 26:
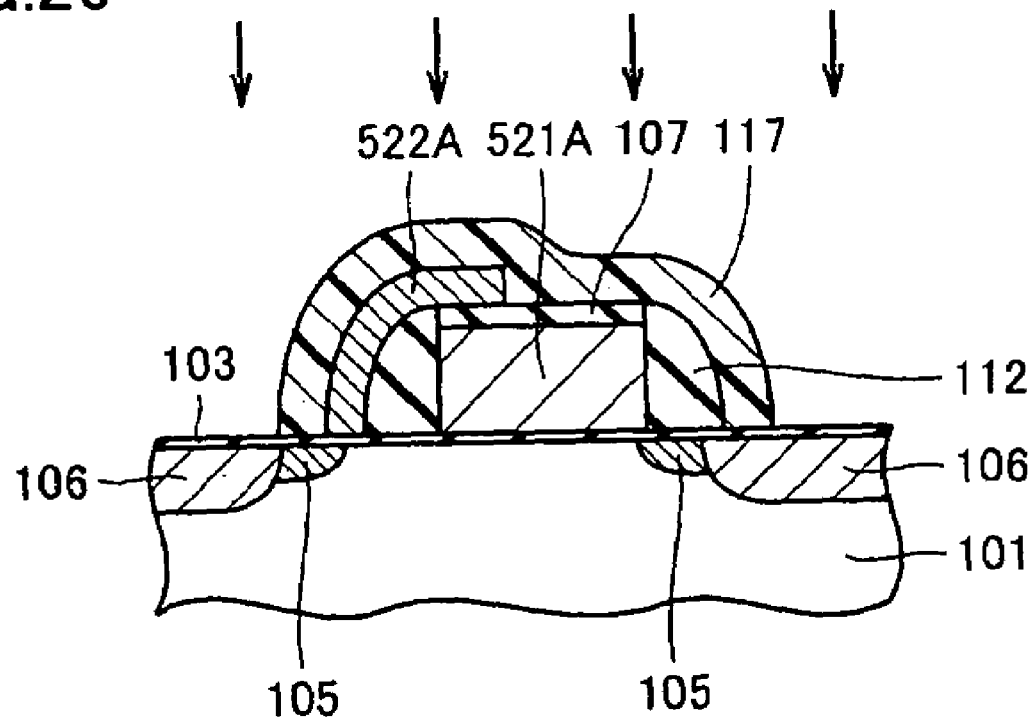

Next, referring to FIG. 26, after removal of resist film 115, a resist film 117 is formed to cover first gate electrode 521A, second gate electrode 522A, exposed sidewall insulating film 112 and the main surface of semiconductor substrate 101 extending on the relevant side. Thereafter, n type impurity is introduced into the main surface of semiconductor substrate 101, using resist film 117 as a mask, to form a high-concentration impurity region 106 having an impurity concentration of about $1 \times 10^{20}$ cm$^3$ in the region on the other side.

As such, access transistor 52A shown in FIG. 21 is completed. Access transistor 52B is formed in the same manner.

The semiconductor memory device employing access transistors 52A, 52B configured as above can also enjoy the operational effects similar to those of the semiconductor memory device of the first embodiment. Further, according to the present embodiment, second gate electrode 522A connected to a node is not distributed in a plurality of portions. Thus, when a minimum unit of design rule is applied to this electrode, the size can be decreased (L×1, where L is the minimum size permitting electrical control of transistor or manufacture thereof) compared to the case where the electrode is distributed in a plurality of portions (L×N). Still further, gate electrode 522A not distributed in a plurality of portions can avoid complication in connection of each electrode.

In the first through third embodiments described above, p channel TFT 56A, 56B are employed as the charge compensating circuits for compensation of the charges lost from capacitors 54A, 54B due to leakage. The p channel TFT may be replaced with a resistance element formed of polysilicon. As the resistance element, one having an appropriate resistance value is selected which can supply a current sufficiently larger than the leakage current from the capacitor and can supply a current smaller than the current leaked from the access transistor in the leakage mode.

Further, in the first through third embodiments described above, the functions of the word line and the node can be switched between first gate electrode 521A and second gate electrode 522A, and similarly between first gate electrode 521B and second gate electrode 522B. It is preferable that the gate length on the word line side is longer than the gate length on the lateral side from the standpoint of stabilizing the ON/OFF currents of the access transistors.

Still further, it has been described that capacitors 54A, 54B are provided for holding the charges corresponding to the stored data. Such provision of capacitors 54A, 54B, however, is unnecessary if nodes 60, 62 each have capacity large enough to guarantee the capacity equivalent to that obtained when capacitors 54A, 54B were provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a word line, a bit line, a charge compensating circuit connected to a node to compensate for charges, and an access transistor connected between said bit line and said charge compensating circuit, wherein
   said access transistor includes
   a pair of impurity regions provided in a main surface of a semiconductor substrate and arranged spaced apart from each other by a prescribed distance to define a channel formation region,
   a first gate electrode provided on said semiconductor substrate, with a gate insulating film interposed therebetween, to face said channel formation region, and
   a second gate electrode adjacent to said first gate electrode, provided on said semiconductor substrate, with a gate insulating film interposed therebetween, to face said channel formation region,
   one of the impurity regions of said access transistor is connected to said bit line and the other of the impurity regions of said access transistor is connected to said node,
   said first gate electrode is connected to said word line, and
   said second gate electrode is connected to an ON/OFF control electrode of said charge compensating circuit.

2. The semiconductor memory device according to claim 1, wherein a gate length of said first gate electrode is made longer than a gate length of said second gate electrode.

3. The semiconductor memory device according to claim 1, wherein
   said first gate electrode has a rectangular shape in cross section, and said second gate electrode has a cross sectional shape increasing in width as it approaches said semiconductor substrate.

4. The semiconductor memory device according to claim 1, wherein
said first gate electrode has a cross sectional shape in which side surfaces are sloped such that a width of said first gate electrode decreases as it approaches said semiconductor substrate, and
said second gate electrode has a cross sectional shape in which a surface facing said side surface of said first gate electrode is sloped to follow the shape of said first gate electrode and a width of said second gate electrode increases as it approaches said semiconductor substrate.

5. The semiconductor memory device according to claim 1, wherein
said first gate electrode has a rectangular shape in cross section, and
said second gate electrode has a cross sectional shape in which said second gate electrode extends to partly cover an upper surface of said first gate electrode on one sidewall side of said first gate electrode.

6. The semiconductor memory device according to claim 1, wherein said second gate electrode is provided on a sidewall region of said first gate electrode with an insulating film interposed therebetween.

7. The semiconductor memory device according to claim 6, wherein said second gate electrode is provided on said sidewall region on each side of said first gate electrode.

* * * * *